United States Patent [19]

Buss

[11] 3,997,973
[45] Dec. 21, 1976

[54] TRANSVERSAL FREQUENCY FILTER

[75] Inventor: Dennis Darcy Buss, Richardson, Tex.

[73] Assignee: Texas Instruments Incorporated, Dallas, Tex.

[22] Filed: Nov. 13, 1974

[21] Appl. No.: 523,591

Related U.S. Application Data

[63] Continuation of Ser. No. 257,252, May 26, 1972, abandoned.

[52] U.S. Cl. .................. 333/70 T; 307/221 D; 307/304; 333/70 A; 357/24
[51] Int. Cl.² ............... H03H 7/10; H03H 7/12; H03H 7/28; H01L 29/78
[58] Field of Search ........... 307/221 D, 221 C, 304; 333/70 A, 70 T, 18; 340/173; 343/17.2 R, 17.2 PC

[56] References Cited

UNITED STATES PATENTS

| | | | |
|---|---|---|---|
| 3,474,260 | 10/1969 | Frobach | 307/221 R |
| 3,543,009 | 11/1970 | Voelcker, Jr. | 333/70 T X |
| 3,622,916 | 11/1971 | Fjallibrant | 333/70 A |
| 3,668,438 | 6/1972 | Chesney et al. | 307/221 C |
| 3,809,923 | 5/1974 | Esser | 307/221 D |

OTHER PUBLICATIONS

Sangster, "The Bucket Brigade Delay Line, a Shift Register for Analogue Signal;" Phillips Technical Review, vol. 31, 1970, No. 4, pp. 97–110.
Smith et al., Active Band Pass Filtering with Bucket–Brigade Delay Lines in IEE Journal of Solid-State Circuits, vol. SC–7, Oct. 1972; pp. 421–425.

Primary Examiner—Alfred E. Smith
Assistant Examiner—Marvin Nussbaum
Attorney, Agent, or Firm—Harold Levine; James T. Comfort; Richard L. Donaldson

[57] ABSTRACT

A charge-transfer transversal filter and method of use is provided. In one aspect of the invention a bandpass filter is provided where the center frequency of the bandpass is variable responsive to the clock rate applied to the charge-transfer devices. In a different aspect of the invention a matched filter for a chirp signal is provided. The filter requires a minimum number of Nyquist samples by including the provision of a clock rate which varies responsive to the frequency sweep of the input chirp signal. A method for detecting a chirp signal is provided which includes the step of selectively varying the clock rate applied to a charge-transfer shift register responsive to the frequency variations of a selected chirp signal.

9 Claims, 11 Drawing Figures

TRANSVERSAL FREQUENCY FILTER

This is a continuation, of application Ser. No. 257,252, filed May 26, 1972, now abandoned.

The present invention pertains to frequency filters in general, and more particularly to charge-transfer transversal filters having selectively variable frequency response characteristics, and methods of use. Analog shift register correlators and charge coupled device and bucket brigade devices are described and claimed in co-pending U.S. patent application Ser. No. 196043 filed Nov. 5, 1971, by Dean Robert Collins et. al. and assigned to the assignee of the present invention.

A variety of applications in the electronic industry require frequency filters of one type or another. For example, in spread spectrum communications systems, radar application etc., matched filters for chirp signals are required. To date, acoustic surface wave devices are essentially the only practical means for providing matched filters for chirp signals. Surface wave devices, however, operate at UHF and VHF frequency and are not effective for low frequency operation. Other filter applications include bandpass filters which are required in numerous types of electronic equipment to select a particular frequency. In many situations it would be desirable to have a bandpass filter, the frequency bandpass of which could be selectively varied without structurally modifying the filter. From an economics viewpoint, it is often imperative to construct the filters using only semiconductor devices integrated on a chip.

Accordingly, an object of the present invention is the provision of a bandpass filter having a variable bandpass and linear phase across the bandpass.

A further object of the invention is a matched filter for chirp signals operable at relatively low frequencies.

An additional object of the invention is a charge transfer device transversal bandpass filter, the bandpass frequency of which is variable responsive to the clock frequency applied to the charge-transfer devices.

Yet another object of the invention is a charge-transfer device transversal matched filter for chirp signals which requires a minimum number of Nyquist samples.

Another object of the invention is charge-transfer device transversal matched filter for a frequency varing input signal where the clock frequency varies responsive to the frequency of the input signal.

A further object of the invention is a charge transfer transversal filter having a plurality of taps weighed so as to produce an impulse response corresponding to the Fourier Transform of a preselected frequency response.

An additional object of the invention in the provision of a method for detecting a preselected chirp signal utilizing a transversal filter wherein a minimum number of shift register delay elements are required.

Briefly in accordance with the invention a transversal filter comprises a charge-transfer device shift register integrated on a semiconductor chip. As used herein, charge-transfer devices include charge-coupled devices (CCD) and bucket-brigades (BB), the latter of which is in essence a row of insulated gate field effect transistors (IGFET) with source and drains connected and with the gates capacitively coupled to the drains. Each of the storage sites of the CCD or BB can be tapped, i.e., sampled, to detect the amplitude of the analogue signal stored therein.

In one embodiment, the tapped signals are respectively "weighted" to produce an impulse response which is the Fourier Transform (FT) of a desired frequency characteristic. The taps may be further weighted to improve sidelobe suppression. The input signal is sampled at a rate equal to or greater than the Nyquist rate corresponding to the desired center frequency of the filter, i.e., at least two samples per wavelength. As understood by those in the art, such sampling is effective to define a sinusoidal type wave. In some situations it is desirable to sample at a rate more frequently than the Nyquist rate to reduce harmonics. The weighted signals are summed to produce the correlated output signal.

In different embodiment of the invention, the transversal charge-transfer filter defines a matched filter for a chirp signal. The output may be obtained by sampling the signal at the Nyquist rate corresponding to the highest frequency of the chirp signal. For such a situation the lower frequency components of the chirp signal are sampled at a much higher rate than the Nyquist rate, and since each sample requires a charge-transfer device storage site, the number of such devices is rather large. Accordingly, it is preferable, in accordance with the invention, to vary the clock rate applied to the charge-transfer devices responsive to the frequency change of the chirp signals. That is, if the chirp signal sweeps linearly from $f_1$ to $f_2$, then the clock rate would also sweep linearly from a frequency corresponding to the Nyquist rate at $f_1$ to a frequency corresponding to the Nyquist rate at $f_2$. Such a clocking system significantly reduces the number of storage sites for a given chirp signal, since each frequency component of the chirp signal is sampled a minimum number of times — i.e., the Nyquist rate.

A method is provided in accordance with the present invention for detecting a preselected chirp signal of known frequency variation and duration utilizing a charge-transfer shift register. Utilizing this method a minimum number of shift register delay elements is required. The method includes applying a chirp input signal to the charge-transfer shift register, and selectively varying the clock frequency of the charge-transfer devices responsive to the frequency variations of the preselected chirp signal. In this manner the input signal is sampled only twice for each wavelength of the preselected chirp signal. The charge stored in each delay element is then sampled by high impedance taps and the signals thus provided are selectively summed to provide the correlated output signal. If the input signal corresponds in frequency variation and duration to the preselected chirp signal, the output signal will be large.

Additional object and advantages of the invention will be apparent upon reading the following detailed description of illustrative embodiments in conjunction with the drawings, wherein.

Figure 6:
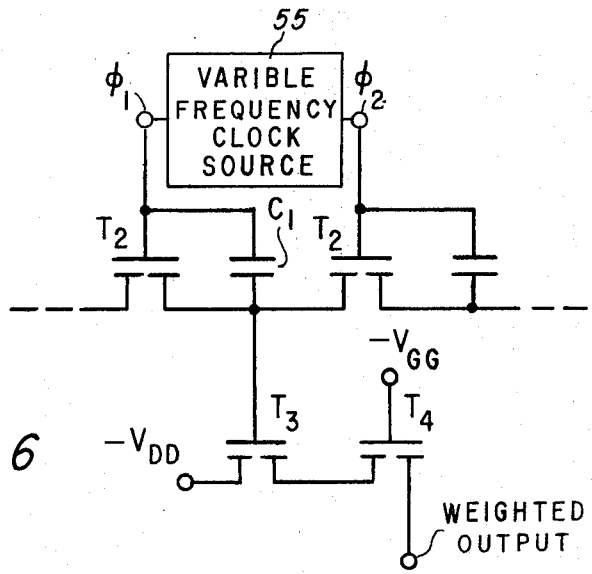
Figure 7:
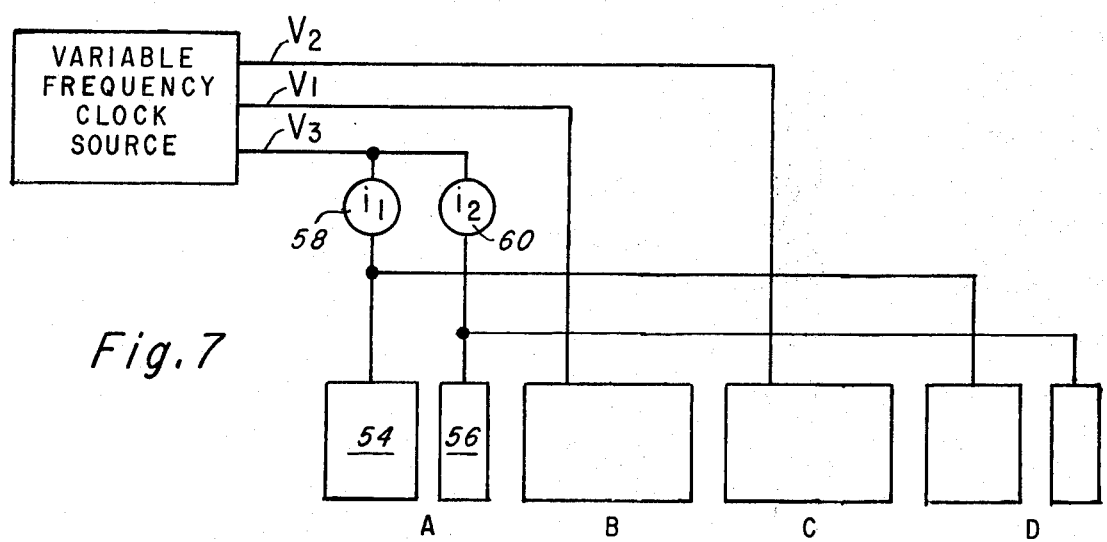
Figure 9A:
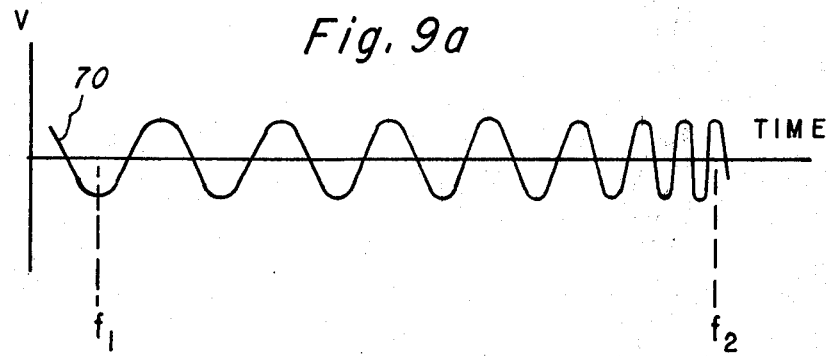
Figure 9B:
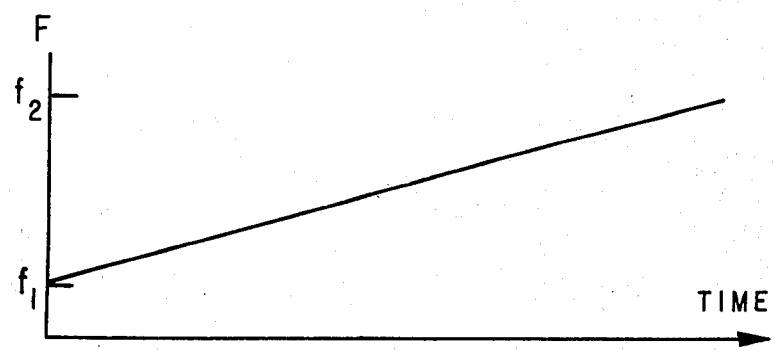
Figure 8A:
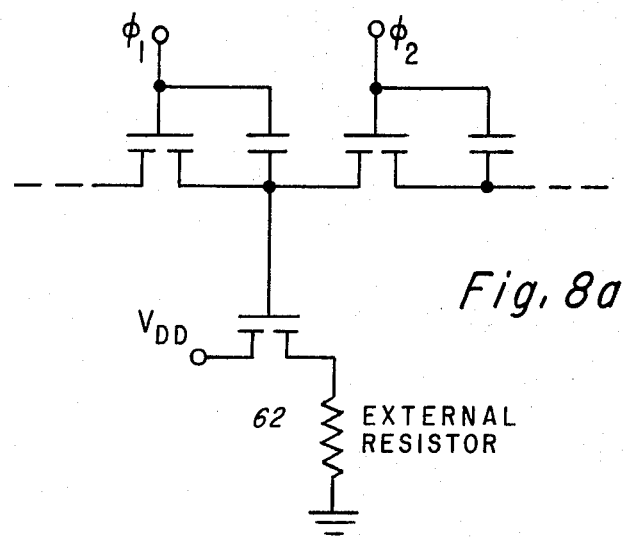
Figure 8B:
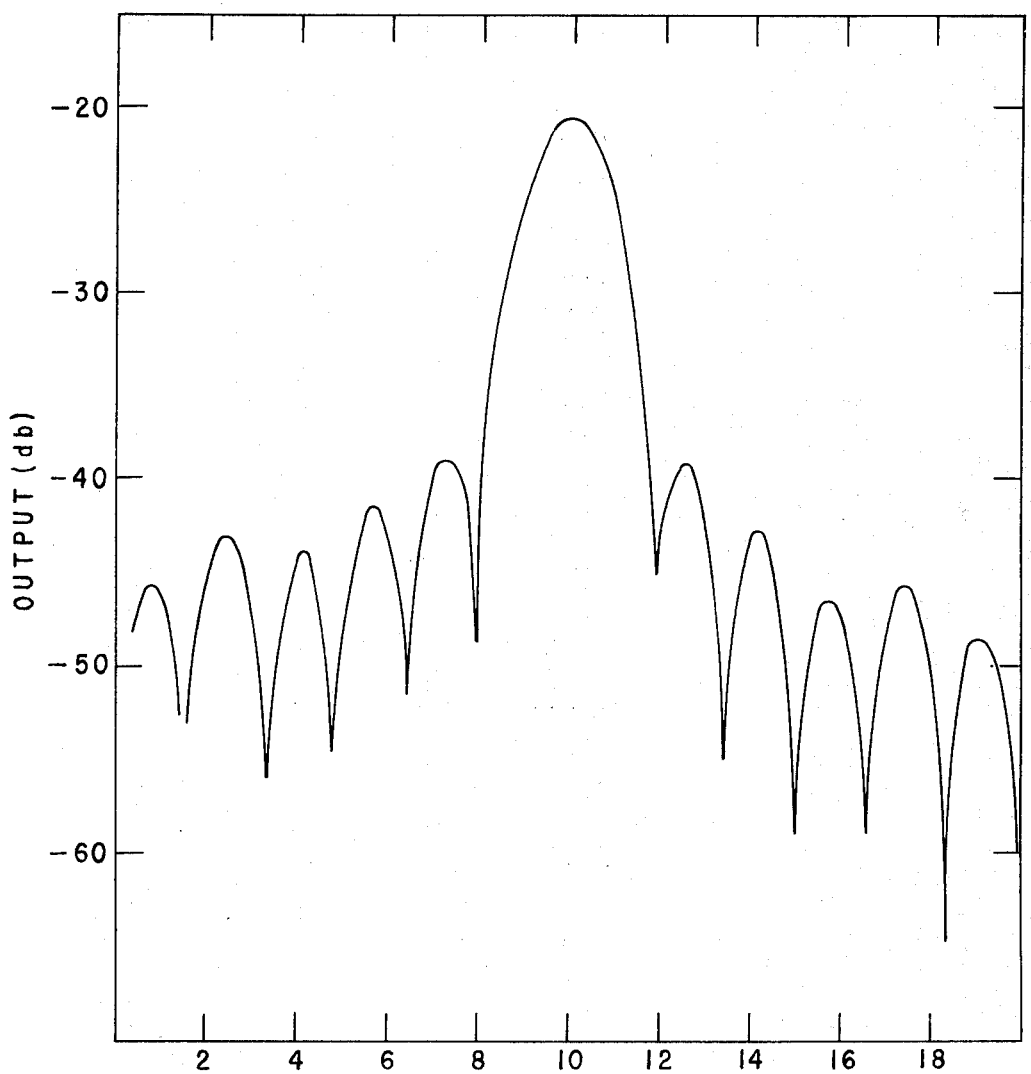

FIG. 6 schematically depicts a BB storage site with a tap weighted by a source-follower IGFET amplifier;

FIG. 7 is a plan view of a CCD illustrating a capacitively weighted voltage tap;

FIG. 8a schematically depicts a portion of a 12 delay element BB bandpass filter fabricated in accordance with the invention;

FIG. 8b illustrates the frequency response obtained from the device of FIG. 8a;

FIG. 9a illustrates a representative chirp signal that may be matched by the transversal filter of the invention; and FIG. 9b illustrates the varying clock frequency that may be used to minimize the number of samples of the signal in FIG. 9a.

Figure 1:
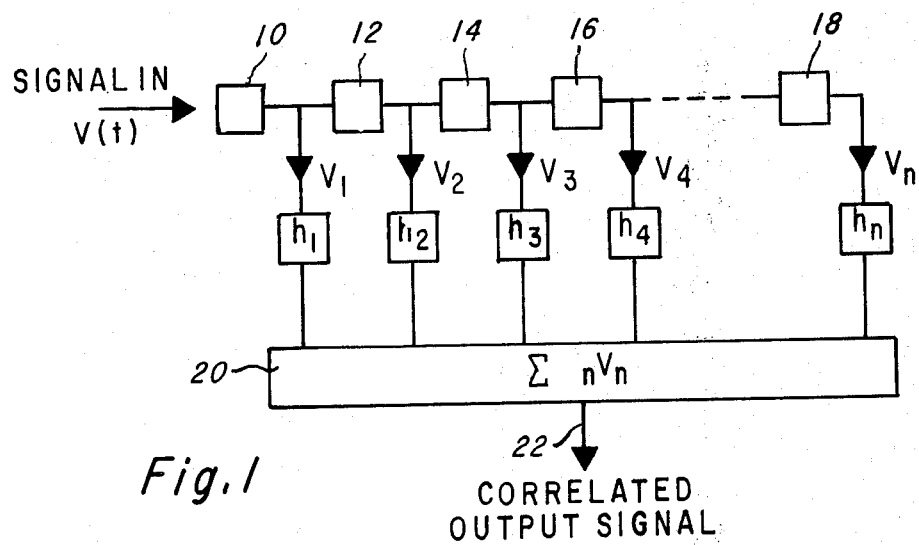
FIG. 1 is a block diagram illustration of a matched filter in accordance with the invention.

With reference now to the drawings, FIG. 1 illustrates in clock diagram format a matched transversal frequency filter in accordance with one aspect of the present invention. The filter includes a series of storage sites or delay elements 10, 12, 14, 16, and 18 which are interconnected and function as a shift register or analogue delay line. The input signal which is to be filtered is periodically sampled to obtain a series of voltage pulses as a function of time. These voltage pulses are sequentially applied to the shift register and are stored in the respective storage sites therein. As illustrated in FIG. 1, the series of voltage pulses are applied to the storage site 10, and are respectively shifted along the various delay elements in shift register fashion.

The analogue signal stored in each of the delay elements or storage sites is sampled to provide a signal corresponding to the amplitude thereof. The sampled or tapped signals are depicted in FIG. 1 as $V_1$, $V_2$, $V_3$, $V_4$, ... $V_N$. In other words, for the situation where the input signal is sampled "N" times, each of the delay elements depicted generally as 10 – 18 will have stored therein a signal corresponding to the input signal, the signal stored in delay element 18 corresponding to the first sample of the input signal and the signal in element 10 corresponding to the last sampled value. The signal in 10 is delayed in time from the signal in 18. The taps $V_1 - V_N$ provide simultaneous signals corresponding to the respective signal values stored in the respective delay element of the shift register.

The tapped signals may be weighted to correspond to a preselected function. Means for weighting the sampled signals are illustrated generally in FIG. 1 as $h_1$, $h_2$, $h_3$, ... $h_n$. Circuit arrangements suitable for providing desired weighting are described more particularly hereinafter with respect to FIGS. 6 and 7. The weighted signals are summed at 20 to provide a correlated output signal 22. As will be described in more detail below, the matched filter illustrated generally in FIG. 1 may be used to provide a bandpass filter having a frequency bandpass, the center frequency of which can be changed merely by varying the clock frequency applied to the shift register delay line comprised of storage sites 10 – 18, and also can be structured to provide a matched filter for a chirp input signal, which filter requires a minimum of delay elements.

In accordance with the present invention, the shift register is comprised of charge-transfer devices. As explained earlier, charge-transfer devices include bucket-brigades and charge coupled devices. As is understood by those skilled in the art, these structures are operable to store and transfer analogue signals. Further, charge-transfer devices are particularly advantageous in that they are less complex than conventional shift registers and are accordingly less expensive.

Conventional semiconductor fabrication techniques may be utilized to construct the charge-transfer devices; such techniques are well documented and need not be repeated herein. In general, a CCD stores charge in potential wells, and moves these wells along from electrode to electrode. By manipulating the charge along a series of electrodes, the CCD functions as a shift register. The basic structure of a three-phase CCD is illustrated in FIG. 2.

Figure 2:
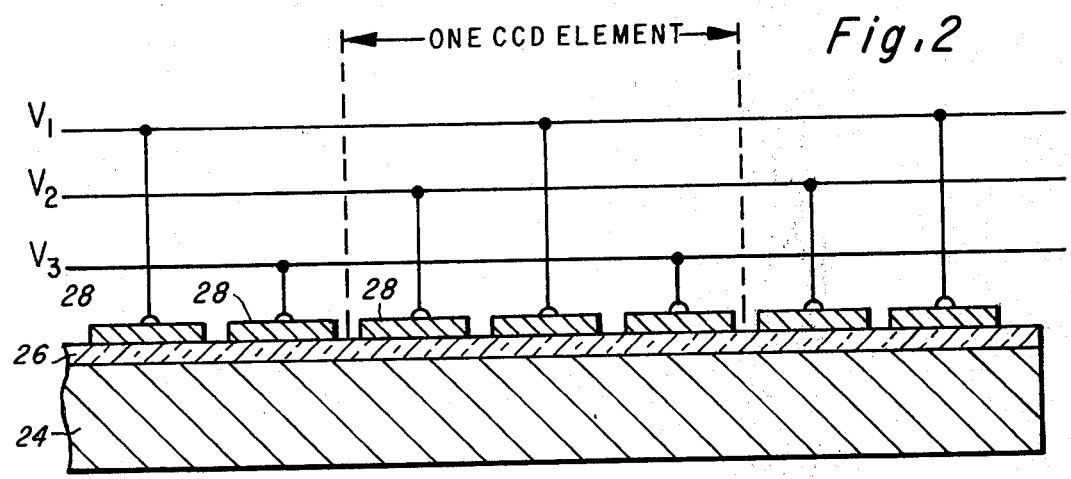
FIG. 2 is a cross-sectional view of a CCD.

With reference to FIG. 2, a semiconductor substrate is shown at 24. The substrate is typically N-type silicon, but of course other semiconductor materials and conductivity types may be used. A relatively thin insulating layer 26 is formed over one surface of the substrate 24. A particularly suitable insulating material is silicon oxide, generally deposited to a thickness of less than 2000 A. A series of closely spaced electrodes shown generally at 28 are formed over the insulating layer 26. These electrodes typically may be spaced on the order of 3 microns or less. Three clock voltages $V_1$, $V_2$, and $V_3$ are required for the three phase CCD. When N-type silicon is used for the substrate, the clock voltages are negative.

In operation of the CCD, charge is stored in and transferred between potential wells. In the storage mode of a three phase CCD, a voltage $V_2$ is greater than the bias voltage $V_1$, and forms a potential well that "captures" the charge. In the transfer mode, charge moves along to the adjacent electrode when a still larger voltage $V_3$ is applied to that electrode, thus creating a larger potential well into which the charge is "dumped".

The bucket-brigade (BB) charge-transfer device is in essence a row of insulated gate field effect transistors (IGFET) with source and drains connected and with the gates capacitively coupled to the drains. The basic structure of a BB is shown in FIG. 3.

Figure 3:
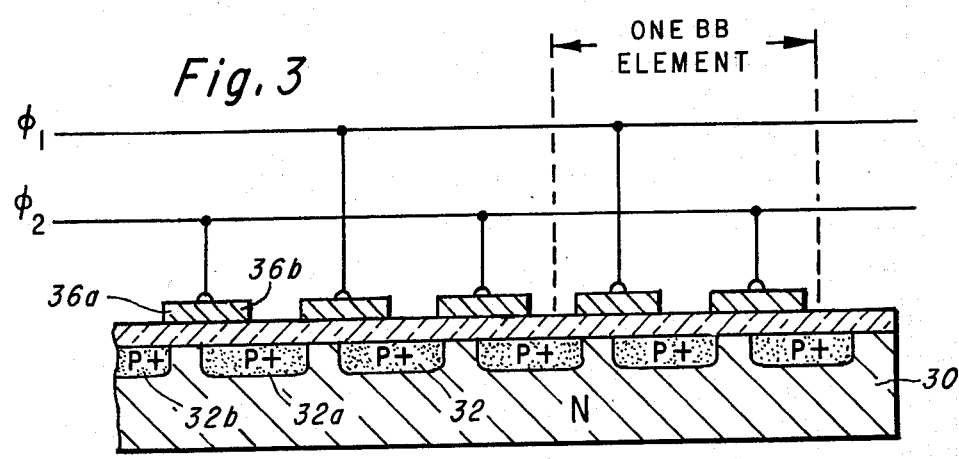
FIG. 3 is a cross-sectional view of a BB.

With reference to FIG. 3, a semiconductor substrate, typically N-type silicon, is shown at 30. A series of opposite conductivity type "islands" are formed in the surface of the substrate 30 by well known selective doping techniques. For the example illustrated in FIG. 3 these P+ regions are illustrated at 32, and respectively form source and drain electrodes of IGFETs of the BB. A relatively thin (generally less than 2000 A) insulating layer 34 of, e.g., silicon oxide is formed over the substrate and opposite conductivity type regions 32. Other insulating materials could be used of course.

Spaced apart conductive gate electrodes 36 are formed over the substrate. Each gate electrode extends over the region of the substrate 32 which lies between two of the P+ islands 32, i.e., the gate extends over the channel region. In the BB structure, it will be noted, however, that the gate electrode extends over a significant portion of the drain region of the respective IGFETs. For example, consider the IGFET defined by source 32b, drain 32a, and gate 36a. A portion 36b of the gate 36a extends over a significant portion of the drain 32a. This produces an enlarged gate to drain capacitance which is used in operation of the BB.

The BB device operates in the two transfer modes, utilizing two clock voltages $\phi_1$ and $\phi_2$. In the storage mode all electrodes 36 are at the same potential. In the transfer mode the potential on one electrode is made large enough to reduce the potential barrier and let charge flow from one P+ region to the adjacent one. This process is repeated until the charge is transferred through the device in normal shift register action.

Figure 4:
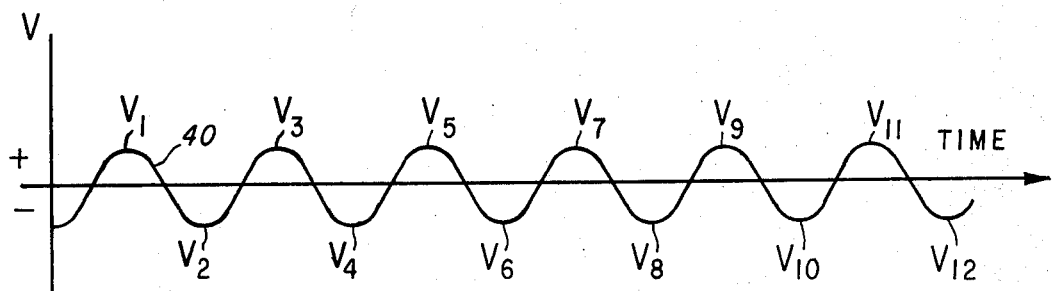
FIG. 4 illustrates a wave sampled at the Nyquist rate.

The charge-transfer devices illustrated in FIGS. 2 and 3 may be used to provide the shift register function of the storage sites 10 – 18 in the matched filter generally described in FIG. 1. As mentioned previously, the matched filter of the present invention is a transversal filter, and utilizes the principle promulgated by Nyquist that a sinusoidal type wave can be defined by sampling the wave at least twice during each wavelength. In this regard, a typical sine wave is illustrated in FIG. 4. Six wavelengths are shown being sampled at the Nyquist rate, the respective samples being shown at $V_1 - V_{12}$. It will be noted that all samples having an odd subscript are positive voltages, while all samples having an even subscript are negative voltages.

Figure 5:
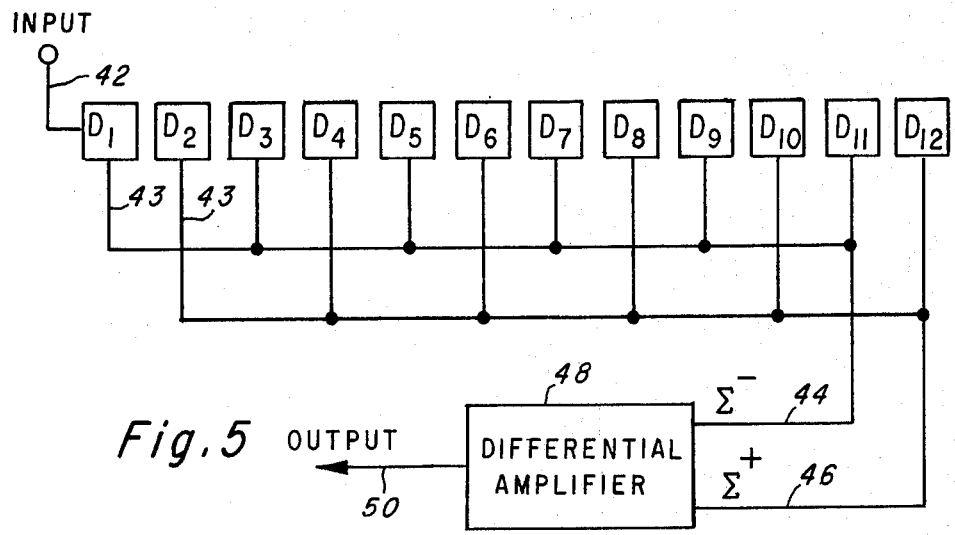
FIG. 5 is a block diagram illustration of a transversal filter for providing a correlated output of the signal sampled in FIG. 4.

With reference to FIG. 5 there is illustrated an arrangement for providing a correlated output of the wave shown in FIG. 4, sampled at $V_1 - V_{12}$. The input 42 comprises sequentially the instantaneous value of voltages $V_1 - V_{12}$. There are 12 storage sites, comprising a shift register for storing the respective values of voltages $V_1 - V_{12}$. The charge-transfer devices which define the storage sites are clocked at a frequency such that two samples are provided for each wavelength at the frequency of the input signal shown in FIG. 4 (i.e., it samples at the Nyquist rate). The signal stored in each of the storage sites is tapped at a node (shown generally at 43) and the tapped signals are summed and applied to a differential amplifier 48.

It will be noted that the first sample $V_1$ of the input signal in FIG. 4 is a positive value and will be stored in element $D_{12}$ of FIG. 5, while the last sampled signal $V_{12}$ will be stored in element $D_1$ during that interval when all 12 samples are stored in the shift register comprising elements $D_1 - D_{12}$. The signals stored in $D_2, D_4, \ldots D_{12}$ are positive values (Corresponding to sampled voltages $V_1, V_3, V_5, \ldots V_{11}$) and are summed on a common line 46 for input to the differential amplifier 48, while elements $D_1, D_3, \ldots D_{11}$ are negative voltage values and are summed in common on the line 44 for input to the differential amplifier. It may be seen that when an input signal such as shown in FIG. 4 has a frequency which corresponds to the rate of sampling such as dictated by the clock rate of the shift register elements $D_1 - D_{12}$, whereby the signal is sampled at the Nyquist rate (or more frequent), then the voltage differential between lines 44 and 46 will be a maximum, providing a correlated output signal 50. In other words, for a given clock rate of the charge-transfer shift register, only one frequency of signal will be passed. Thus, by varying the clock rate the center frequency of the bandpass may be controlled.

In accordance with the present invention, a transversal frequency charge-transfer device bandpass filter having a preselected bandpass characteristic and characterized by a bandpass center frequency which can be varied merely by changing the clock rate of the charge-transfer devices is provided. The matched filter has taps which are weighted such that they produce an impulse response which is the Fourier Transform (FT) of a desired frequency response characteristic. For example, the kth tap of the shift register may be weighted to have a tap weight $$h_k = \sin\left(\frac{2\pi K}{N_T}\right)$$

wherein $N_T$ is greater than or equal to 2, and is the number of taps per wavelength of the filter's impulse response. The impulse response of the filter is approximated by the expression:

$$\sin\left[\frac{2\pi}{N_T} \int_2^T f_c(t')dt'\right]$$

where $f_c(t')$ is the clock frequency of the charge-transfer devices, and may vary in time. For the bandpass filter, $f_c$ is independent of time, and the impulse response is thus approximated by the expression:

$$\sin\frac{2\pi f_c t}{N_T}$$

for a total of $N_W$ wavelengths of the impulse response. Since each period or wavelength is sampled $N_T$ times, the total number of storage sites or bits $N_B$ is $N_T N_W$, and such a filter will pass signals having a frequency $f_o$ near $$f_o = \frac{f_c}{N_T}$$

From this it is seen that the center frequency of the bandpass is determined by the clock frequency.

Various techniques for weighting the taps of the delay line or shift register may be utilized. For example, in FIG. 6 there is illustrated schematically a weighting arrangement that employs a source-follower IGFET amplifier. This weighting technique is particularly advantageous for the structure where the charge-transfer device shift register comprises a BB.

With reference to FIG. 6, the storage site of the shift register, i.e., one BB element includes IGFET transistors $T_1$ and $T_2$. As understood by those skilled in the art, the signal is stored by the enhanced gate to drain capacitance illustrated at $C_1$. This capacitance is illustrated in FIG. 3 by the overlap portion 36b of the gate. Two clocks, $\phi_1$ and $\phi_2$ are respectively connected to the gates of transistors $T_1$ and $T_2$. A source-follower amplifier includes transistors $T_3$ and $T_4$. The gate of transistor $T_3$ is connected to node 52 and detects the presence of the signal stored via the gate to drain capacitance $C_1$. Transistor $T_3$ provides a high impedance tap and thus does not drain the stored charge on capacitance $C_1$ which represents the signal. The output signal is taken from the drain of $T_4$, and the value of the signal is weighted according to the impedance of $T_4$. Preferably, the impedance of $T_4$ is controlled by defining the W/L ratio of the transistor. Other techniques could be used of course, such as varying the gate voltage applied to $T_4$.

Thus, each storage element of the charge-transfer shift register may be weighted by controlling the W/L ratio of the source-follower amplifier in order to produce a transversal frequency bandpass filter having a preselected frequency response characteristic. The weighting, for example, can be controlled to provide desired sidelobe suppression of the response characteristics. In the subsequent discussion of FIG. 8, representative weighting values for a 12 bit BB bandpass filter to produce sidelobe suppression of about 20 db are illustrated.

With reference to FIG. 7, an alternative technique for weighting the tapped signals is illustrated in conjunction with a CCD structure. In this technique the value of the stored signal is determined by integrating the clock current required to recharge the electrode capacitance. This technique is particularly well suited for CCD structures, but may also be used in the BB. Also, the technique illustrated in FIG. 6 as being preferable for use in the BB structure could be used for CCDs if desired.

In the technique illustrated in FIG. 7, the total value of the stored signal is determined by the amount of current required to recharge the electrodes, shown generally at A, B, C, and D. As illustrated the current is measured only in clock $V_3$ and only the electrodes associated therewith need be weighted. It may be desirable to measure the current in all clock lines to improve the signal to noise ratio. This would require weighting all electrodes. A weighting function may be introduced by splitting the electrode into two separate values and measuring only a selected portion of the current required to recharge the electrode to a reference potential. This is illustrated in FIG. 7 where electrode A has two portions 54 and 56. It will be noted that both portions of the electrode A are connected to clock voltage $V_3$, but that the current required to recharge the capacitance associated with portion 56 to its reference potential and the current required to recharge portion 54 are separately measurable, as indicated by current measuring devices 58 and 60. As schematically illustrated, to provide the correlated output signal, all of the right hand portions of electrodes associated with stored signals (it being recalled that in a three-phase CCD system, only every third electrode stores charge) are commonly connected together, and similarly the left hand portions are commonly connected and the current difference provides the desired weighted signal.

With reference to FIG. 8a one delay element of a 12 bit BB transversal frequency bandpass filter fabricated in accordance with the present invention is illustrated. The weighting technique described with reference to FIG. 6 was utilized with the exception that as a matter of convenience, external resistors 62 were utilized to provide the desired impedance for the weighting function rather than the preferable W/L ratio control. The BB was fabricated on 1.45 ohm-centimeter N-type silicon, A $V_{DD}$ voltage of about −18 volts was used in conjunction with a clock voltage of −10 volts. The external resistors were chosen to give six cycles of sine wave sampled at the Nyquist rate and weighted to give good sidelobe rejection. With reference, e.g., to FIG. 4 which illustrates Nyquist rate sampling of a six wavelength sine wave, the sampled values $V_1 - V_{12}$ were weighted with external resistors 62 as shown below:

$V_1$ — 50K ohms
$V_2$ — 38K ohms
$V_3$ — 30K ohms
$V_4$ — 25K ohms
$V_5$ — 22K ohms
$V_6$ — 20K ohms
$V_7$ — 20K ohms
$V_8$ — 22K ohms
$V_9$ — 25K ohms
$V_{10}$ — 30K ohms
$V_{11}$ — 38K ohms
$V_{12}$ — 50K ohms With reference to FIG. 8b there is illustrated the bandpass frequency response characteristics of the filter fabricated according to FIG. 8s. As may be seen there is sidelobe suppression of about 20db for a bandpass having a center frequency of 10 KHz.

The transversal frequency filter of the present invention can also be used to provide a matched filter for a chirp input signal. With reference to FIG. 9a there is illustrated a typical chirp signal which sweeps from a low frequency $f_1$ to a higher frequency $f_2$ during a given time interval. A matched filter can be produced by sampling the input signal at the Nyquist rate corresponding to the highest frequency ($f_2$ for the signal illustrated in FIG. 9a). For this situation, after the sampling of a selected number of wavelengths corresponding to the frequency sweep of the chirp signal, a filter as illustrated generally in FIG. 1 would provide a correlated output signal. Sampling at the Nyquist rate corresponding to the highest frequency requires a large number of samples (and correspondingly, a large number of shift register delay elements). The number of samples can be reduced by sampling the lower frequency components of the chirp filter only at the Nyquist rate. Using a clock rate of a fixed frequency, the lower frequency components of the chirp signal are sampled much more frequently than required. However, by varying the clock rate frequency in a manner as illustrated in FIG. 9b, (for the situation where the chirp signal sweeps linearly in frequency) all frequency components of the chirp input signal are sampled at the minimum rate (i.e., Nyquist rate) and the number of samples is minimized. This savings may be substantial. For example, if the frequency span of the chirp is much larger than the initial frequency $f_1$, a savings of approximately one-half the total bits (as compared to a fixed frequency clock rate) may be effected. In FIGS. 6 and 7 variable frequency clock sources are illustrated at 55. Such clock sources are known in the art and need not be described herein.

In accordance with the present invention, utilization of charge-transfer devices to define transversal frequency filters provides numerous advantageous results. For example, the bandpass filter produces a response having linear phase across the bandpass. Such a characteristic is not possible with conventional resonator type filters. Further, charge-transfer devices are low-signal level devices and are characterized by extremely low level of noise. This often enable direct sampling of the signal without the requirement of first amplifying it with a broadband amplifier. With respect to the matched filter for chirp signals in accordance with the invention, a filter is advantageously provided which is operable a low frequencies (essentially from dc to the megahertz range). This is distinguished from the only other effective matched filter for chirp signals, acoustic surface wave devices, which are operable only at high (microwave) frequencies. Additionally, with respect to the bandpass filter in accordance with the present invention, the center frequency of the bandpass is tunable merely by varying the clock frequency. Such a filter has obvious advantages is systems which require selection of different frequency signals.

While the present invention has been described in detail with respect to specific embodiments, it is to be appreciated that various changes may be suggested to those skilled in the art without departing from the scope or spirit of the invention. For example, it will often be advantageous to sample at a rate more frequent than the Nyquist rate to reduce harmonics.

What is claimed is:

1. A transversal band pass filter having variable band pass frequency comprising:

a charge-transfer shift register including a plurality of semiconductor charge-transfer devices formed at a common surface of a semiconductor substrate, said charge-transfer devices defining serially arranged delay elements of said shift register and including control electrodes separated from said semiconductor substrate by an insulating layer; variable frequency clock source means for applying clock signals selectively to said control electrodes to effect storage of said input signals in said delay elements in the form of electrical charge and to effect shift register transfer of said stored charges between delay elements of said shift register at a preselected rate corresponding to a desired band pass center frequency for said filter defined by a preselected frequency of said clock source such that said band pass center frequency can be selectively varied by changing the frequency of said clock source means; circuit means coupled to respective delay elements of said shift register for detecting the amplitude of a charge stored therein to produce a detected signal and for selectively weighting the amplitude of said detected signal, said circuit means including a high impedance detector comprising a first insulated gate field effect transistor having source, drain and gate, means coupling said gate to a node of said shift register to provide a high impedance tap, means connecting said first field effect transistor and a second insulated gate field effect transistor to form a source follower amplifier, said second field effect transistor including a source providing an output signal from said source follower amplifier weighted dependent on the impedance of said second field effect transistor.

2. A transversal band pass filter having a selectively variable band pass comprising:

a bucket brigade shift register including a plurality of information storage delay element, each said delay element having an electrical charge storage node and including at least two insulated gate field effect transistors having source, drain and gate and including gate-drain capacitance, each said charge storage node defined by the gate-drain capacitance of a said field effect transistor, said shift register having a signal input; means for entering into said signal input data corresponding to samples of an input signal; variable frequency clock source means for applying clock signals selectively to the gates of said field effect transistors to clock said input signal data samples into said shift register and to shift stored data samples along said shift register at a predetermined rate, said predetermined rate corresponding to a frequency of said clock source selected to provide a shift rate enabling storage of said input signal data at a rate corresponding to at least two samples per wavelength of a preselected band pass center frequency determined by said selected frequency of said clock source; high impedance circuit means for detecting the charge stored at each charge storage node and for weighting said detected signal with a preselected weighting value, each said high impedance means including a first insulated gate field effect transistor having a channel and gate, means connecting said gate to a said storage node of said shift register, and a second insulated gate field effect transistor having a channel and source, and means serially connecting the channels of said first and second field effect transistors to define a source-follower amplifier, the said second field effect transistor having a preselected channel width-length ratio defining a selected effective weighting value for said detected signal; the respective weighting values of the said second field effect transistors being selectively determined to produce an impulse response of said filter corresponding to the Fourier Transform of a preselected frequency response characteristic; and means coupled to the sources of the respective second field effect transistors for selectively summing said weighted signals to provide a correlated output signal.

3. A transversal band pass filter having a selectively variable band pass frequency comprising: a substrate having a charge coupled device shift register defined at one surface thereof, said shift register having a plurality of delay elements each including a plurality of control electrodes, means insulating said control electrodes from said substrate to provide means for storing charge at each said delay element, said shift register having an input and including means for entering data into said input corresponding to samples of an input signal; variable frequency clock source means electrically connected to said plurality of control electrodes for transferring sampled data from said input into said shift register in the form of electrical charge and to shift stored data charge along said shift register at a predetermined rate enabling shifting of data charge at a rate corresponding to at least two samples per wave-length of a preselected band pass center frequency selectively determinable by said frequency of said clock source; high impedance means coupled to each said shift register delay element for detecting the magnitude of charge stored therein and for weighting the detected signal with a predetermined weighting value, said detection and weighting means including selected ones of said control electrodes divided into at least two electrode portions having respective areas which determine a desired weighting factor for that said delay element, means connecting said clock source means to said electrode portions to selectively apply current thereto to recharge said electrode portions to a reference voltage, said recharge current being dependent on the charge stored by said delay element and on the area of the corresponding electrode portion; and means connected to said two electrode portions, and means connected to said two electrode portions of all said delay elements for selectively summing the recharge currents of one said electrode portion of each delay element relative to the recharge currents of the other said electrode portion of each delay element thereby producing a weighted correlated output signal.

4. A transversal frequency matched filter for a preselected chirp signal of predetermined duration and having a predetermined lower frequency and a predetermined higher frequency comprising:

a charge-transfer shift register including control electrodes for controlling the transfer of data between delay elements thereof, said plurality of delay elements being at least equal to the number of samples required during said preselected time period to sample said chirp signal at a rate corresponding to at least two samples per wavelength at said higher frequency; clock signal source means connected to said shift register for (a) sampling said chirp signal at a rate corresponding to at least two samples per wavelength at said higher frequency and inputting said samples into said shift register for storage therein in the form of electrical charges, and (b) for applying clock signals selectively to said control electrodes to effect shift register transfer of said stored charges between delay elements of said shift register at a rate corresponding to at least two samples per wavelength at said higher frequency; high impedance detector means coupled to respective delay elements of said shift register to produce electrical signals corresponding to said charges and selectively amplitude weighting said signals; and means for summing said detected signals to produce a preselected correlated output signal corresponding in frequency variation and duration to said preselected chirp signal input.

5. A transversal frequency matched filter according to claim 4, wherein each said high impedance detector means comprises a high impedance detector including a first insulated gate field effect transistor having source, drain and gate; means coupling said gate to a shift register delay element to provide a high impedance tap; means connecting said first field effect transistor and a second insulated gate field effect transistor to form a source follower amplifier; said second field effect transistor having a selected weighting impedance and including a source providing an output signal weighted dependent on said selected impedance of said second field effect transistor.

6. A transversal frequency matched filter for a preselected chirp signal variable between predetermined lower and higher frequencies in a predetermined time period, comprising:
a charge-transfer shift register having a plurality of delay elements and including input means for receiving data samples of said preselected chirp signal for entry into said shift register as electrical charges, and including control electrodes for each said delay element for controlling transfer of said charges between delay elements of said shift register; said plurality of delay elements corresponding in number to two delay elements per wavelength of each frequency component of said chirp signal during said predetermined time period; variable frequency clock source means coupled to said control electrodes for selectively varying the shift rate of said shift register as a function of said frequency variation of said preselected chirp signal such that each wavelength of each frequency component of said chirp signal is only sampled two times, thereby minimizing the number of shift register bits required for filtering a preselected chirp signal; a plurality of detectors including high impedance taps coupled to respective delay elements of each shift register for detecting the relative amplitudes of charges stored in respective delay elements of said shift register and producing detected signals having selective amplitude weightings; means for summing said amplitude weighted detected signals to produce a correlated output signal responsive to and corresponding in frequency variation and duration with said preselected chirp signal.

7. A transversal frequency matched filter according to claim 6, wherein each said detector comprises:
a first insulated gate field effect transistor having source, drain and gate; means coupling said gate to a shift register delay element to provide a said high impedance tap; means connecting said first field effect transistor and a second insulated gate field effect transistor to form a source follower amplifer, said second field effect transistor having a selected weighting impedance and including a source providing an output signal weighted dependent on the weighting impedance of said second field effect transistor.

8. A method for detecting a preselected chirp signal variable between known lower and higher frequencies over a known time period, utilizing a charge-transfer shift register having a plurality of taps at charge storage nodes and a minimal number of delay elements, comprising the steps of:
applying clock signals to the said shift register to input samples of a said chirp input signal to said shift register; selectively varying the frequency of said clock signals in response to the frequency variations of said preselected chirp signal to effect said sampling and shifting of said input signal at a rate corresponding to two samples of each wavelength of said preselected chirp signal to effect said sampling and shifting of said input signal at a rate corresponding to two samples of each wavelength of said preselected chirp signal; non-destructively detecting the signal sample stored at the storage node of delay element of said shift register using a high impedance detector to provide detected signals having amplitudes dependent on the signal samples stored at the respective storage nodes; selectively amplitude weighting the said detected signals with preselected weighting values; and selectively summing said weighted signals to provide a correlated output signal in response to a said input signal which corresponds in frequency variation and duration to said preselected chirp signal.

9. A method according to claim 8, for detecting a preselected chirp signal that varies in a linear manner between said lower and higher frequencies over said known time period, and wherein the frequency of said clock signals is varied in a corresponding linear manner from said lower frequency to said higher frequency over said known time period.

* * * * *